US011082051B2

(12) United States Patent
Allan

(10) Patent No.: US 11,082,051 B2
(45) Date of Patent: Aug. 3, 2021

(54) APPARATUS AND METHODS FOR TIMING OFFSET COMPENSATION IN FREQUENCY SYNTHESIZERS

(71) Applicant: Analog Devices Global Unlimited Company, Hamilton (BM)

(72) Inventor: Gordon John Allan, Ottawa (CA)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/977,171

(22) Filed: May 11, 2018

(65) Prior Publication Data

US 2019/0346877 A1 Nov. 14, 2019

(51) Int. Cl.
*H03L 7/087* (2006.01)
*H03L 7/089* (2006.01)
*H03L 7/107* (2006.01)

(52) U.S. Cl.
CPC ............ *H03L 7/0893* (2013.01); *H03L 7/087* (2013.01); *H03L 7/0895* (2013.01); *H03L 7/0898* (2013.01); *H03L 7/1072* (2013.01)

(58) Field of Classification Search
CPC ..... H03L 7/0893; H03L 7/087; H03L 7/1072; H03L 7/0895; H03L 7/0898
See application file for complete search history.

(56) References Cited

U.S. PATENT DOCUMENTS

| | | | |
|---|---|---|---|
| 5,675,291 A * | 10/1997 | Sudjian | .................. H03L 7/107 331/14 |
| 5,825,813 A | 10/1998 | Na | |
| 6,028,905 A * | 2/2000 | Gaines | .................. H03L 7/0891 375/376 |
| 6,456,164 B1 | 9/2002 | Fan | |
| 6,463,266 B1 | 10/2002 | Shohara | |
| 6,516,184 B1 | 2/2003 | Damgaard | |
| 6,556,086 B2 | 4/2003 | Keaveney et al. | |
| 6,710,951 B1 | 3/2004 | Cloke | |

(Continued)

FOREIGN PATENT DOCUMENTS

| | | |
|---|---|---|
| CN | 1380749 A | 11/2002 |
| CN | 1464637 A | 12/2003 |

(Continued)

OTHER PUBLICATIONS

Synchronization and MIMO Capability with USRP Devices, Ettus Research, downloaded on Aug. 10, 2016 from World Wide Web page: ettus.com/content/files/kb/mimo_and_sync_with_usrp_updated.pdf, 10 pages.

(Continued)

*Primary Examiner* — Thomas J. Hiltunen
(74) *Attorney, Agent, or Firm* — Knobbe, Martens, Olson & Bear, LLP

(57) ABSTRACT

Apparatus and methods for timing offset compensation of frequency synthesizers are provided herein. In certain embodiments, an electronic system includes a frequency synthesizer, such as a fractional-N phase-locked loop (PLL), which generates an output clock signal based on timing of a reference clock signal. Additionally, the electronic system includes an integer PLL configured to compensate for a timing offset, such as a phase offset and/or frequency offset, of the frequency synthesizer based on timing of the output clock signal.

20 Claims, 9 Drawing Sheets

(56) References Cited

U.S. PATENT DOCUMENTS

| | | | |
|---|---|---|---|
| 6,822,483 B1* | 11/2004 | Fu | G01R 25/005 327/2 |
| 6,845,126 B2 | 1/2005 | Dent | |
| 6,922,162 B2* | 7/2005 | Horsky | H03M 1/685 341/136 |
| 7,155,180 B2 | 12/2006 | Kim | |
| 7,312,663 B2* | 12/2007 | Abel | H03L 7/093 327/156 |
| 7,317,360 B2 | 1/2008 | Keaveney | |
| 7,319,724 B2 | 1/2008 | Kishi | |
| 7,362,826 B2 | 4/2008 | Willingham | |
| 7,394,885 B2* | 7/2008 | Giunco | H03L 7/087 332/127 |
| 7,398,056 B1 | 7/2008 | Ebert | |
| 7,463,100 B2* | 12/2008 | Kim | H03D 13/003 327/3 |
| 7,463,710 B2 | 12/2008 | Walsh et al. | |
| 7,466,785 B2 | 12/2008 | Sanduleanu | |
| 7,560,960 B2* | 7/2009 | Park | H03L 7/183 327/105 |
| 7,606,341 B2 | 10/2009 | Pereira | |
| 7,656,236 B2* | 2/2010 | Williams | H03L 7/087 331/1 R |
| 7,672,364 B2 | 3/2010 | Kang | |
| 7,733,949 B2 | 6/2010 | Jin | |
| 7,734,000 B2 | 6/2010 | Kuo | |
| 7,804,926 B2 | 9/2010 | Sanduleanu | |
| 7,826,808 B2 | 11/2010 | Faulkner | |
| 7,936,222 B2* | 5/2011 | Wang | H03L 7/087 331/11 |
| 7,986,745 B2 | 7/2011 | Hosaka | |
| 8,008,956 B1* | 8/2011 | Shin | H03L 7/085 327/157 |
| 8,054,114 B2* | 11/2011 | Kuo | H03L 7/235 327/147 |
| 8,063,707 B2* | 11/2011 | Wang | H03L 7/087 331/10 |
| 8,106,690 B2 | 1/2012 | Sakaguchi | |
| 8,121,233 B2 | 2/2012 | Chang | |
| 8,269,563 B2* | 9/2012 | Ballantyne | H03L 7/099 331/1 A |
| 8,284,824 B1 | 10/2012 | Smaini | |
| 8,340,167 B2 | 12/2012 | Feng | |
| 8,358,729 B2 | 1/2013 | Bae | |
| 8,378,751 B2 | 2/2013 | Fagg | |
| 8,615,064 B2* | 12/2013 | Sai | H03L 7/087 375/376 |
| 8,618,851 B2* | 12/2013 | Li | H03L 7/091 327/147 |
| 8,665,938 B2 | 3/2014 | Yu | |
| 8,755,751 B2 | 6/2014 | Brunel et al. | |
| 8,816,724 B2 | 8/2014 | Kennedy | |
| 8,890,624 B2 | 11/2014 | Chen et al. | |
| 8,897,735 B2 | 11/2014 | Kim | |
| 8,917,759 B2 | 12/2014 | Xu | |
| 8,958,504 B2 | 2/2015 | Warke | |
| 8,995,517 B2 | 3/2015 | Delforce | |
| 9,008,161 B1 | 4/2015 | Chang | |
| 9,024,568 B2* | 5/2015 | Suzuki | H02P 23/22 318/798 |
| 9,048,847 B2 | 6/2015 | McLaurin et al. | |
| 9,065,459 B1 | 6/2015 | Buell | |
| 9,203,448 B2 | 12/2015 | Morita | |
| 9,280,928 B2* | 3/2016 | Li | G09G 3/32 |
| 9,300,444 B2 | 3/2016 | Hormis | |
| 9,325,553 B2 | 4/2016 | Kaukovuor | |
| 9,385,790 B1 | 7/2016 | Mukherjee | |
| 9,432,030 B2* | 8/2016 | Chen | H03L 7/0898 |
| 9,455,854 B2* | 9/2016 | Gao | H04B 17/21 |
| 9,614,557 B1 | 4/2017 | Mayer et al. | |
| 9,673,847 B1 | 6/2017 | Mayer et al. | |
| 9,948,312 B2* | 4/2018 | Janardhanan | H03L 7/087 |
| 9,960,774 B2* | 5/2018 | Amirkhany | H03L 7/0891 |
| 9,979,408 B2 | 5/2018 | Mayer et al. | |
| 10,291,389 B1* | 5/2019 | Midha | H03C 3/0925 |
| 2003/0151455 A1 | 8/2003 | Kawai | |
| 2003/0153273 A1 | 8/2003 | Ebert | |
| 2003/0171110 A1 | 9/2003 | Shi | |
| 2003/0206603 A1 | 11/2003 | Husted | |
| 2005/0111605 A1* | 5/2005 | Loke | H03L 7/0893 375/375 |
| 2006/0034356 A1 | 2/2006 | Fechtel | |
| 2006/0035601 A1 | 2/2006 | Seo | |
| 2006/0141963 A1* | 6/2006 | Maxim | H03L 7/0891 455/192.1 |
| 2007/0077906 A1 | 4/2007 | Kirichenko | |
| 2007/0152762 A1 | 7/2007 | Hung et al. | |
| 2007/0247233 A1 | 10/2007 | Keaveney | |
| 2008/0008067 A1 | 1/2008 | Arisaka | |
| 2008/0048788 A1* | 2/2008 | Yu | H03L 7/10 331/16 |
| 2008/0111633 A1* | 5/2008 | Cranford | H03L 7/1072 331/10 |
| 2008/0280581 A1 | 11/2008 | Rofougaran et al. | |
| 2009/0054007 A1 | 2/2009 | Kawabe et al. | |
| 2009/0146736 A1 | 6/2009 | Kim | |
| 2009/0184773 A1 | 7/2009 | Woo et al. | |
| 2009/0232195 A1 | 9/2009 | Ozawa | |
| 2010/0087227 A1 | 4/2010 | Francos | |
| 2010/0150289 A1 | 6/2010 | Sunaga | |
| 2010/0239057 A1 | 9/2010 | Chang et al. | |
| 2011/0013724 A1 | 1/2011 | Metreaud | |
| 2011/0292978 A1 | 12/2011 | Kravitz | |
| 2012/0230176 A1 | 9/2012 | Komninakis | |
| 2012/0300818 A1 | 11/2012 | Metreaud | |
| 2013/0009679 A1* | 1/2013 | Sindalovsky | H03L 7/08 327/147 |
| 2013/0266045 A1 | 10/2013 | Lakkis | |
| 2013/0272175 A1 | 10/2013 | Zargari et al. | |
| 2014/0134943 A1 | 5/2014 | Hobbs | |
| 2014/0192923 A1 | 7/2014 | Matsuo | |
| 2015/0063517 A1 | 3/2015 | Verlinden et al. | |
| 2015/0084676 A1 | 3/2015 | McLaurin et al. | |
| 2015/0118980 A1 | 4/2015 | Leung et al. | |
| 2015/0222418 A1 | 8/2015 | Akita | |
| 2015/0311989 A1 | 10/2015 | Richmond | |
| 2016/0036451 A1 | 2/2016 | Kamali | |
| 2016/0043860 A1 | 2/2016 | Tu | |
| 2016/0087783 A1 | 3/2016 | Lin | |
| 2016/0087784 A1 | 3/2016 | Lin | |
| 2017/0134031 A1 | 5/2017 | Ezell et al. | |
| 2018/0294817 A1 | 10/2018 | Mayer et al. | |
| 2019/0280698 A1* | 9/2019 | Kearney | H03L 7/1976 |

FOREIGN PATENT DOCUMENTS

| | | |
|---|---|---|
| CN | 101150316 A | 3/2008 |
| CN | 101373951 A | 2/2009 |
| CN | 201887747 U | 6/2011 |
| CN | 102823161 A | 12/2012 |
| CN | 103986565 A | 8/2014 |
| CN | 104467834 A | 3/2015 |
| JP | 2012-49659 | 3/2012 |
| WO | WO 2005/002055 A2 | 1/2005 |

OTHER PUBLICATIONS

Urbansky et al., "A Novel Slave-Clock Implementation Approach for Telecommunications Network Synchronisation," Proceedings of the European Frequency & Time Forum (1996) pp. 534-539.

Woo et al., "Fast-lock Hybrid PLL Combining Fractional- & Integer-N Modes of Differing Bandwidths" dated Mar. 2008, in 2 pages.

Extended European Search Report in EP19172354.3 filed May 2, 2019.

* cited by examiner

APPARATUS AND METHODS FOR TIMING OFFSET COMPENSATION IN FREQUENCY SYNTHESIZERS

FIELD OF THE DISCLOSURE

Embodiments of the invention relate to electronic systems, and more particularly, to timing offset compensation in frequency synthesizers.

BACKGROUND

Frequency synthesizers can be used in a variety of applications for generating an output clock signal having a controlled timing relationship with respect to a reference clock signal. Frequency synthesizers can be used in, for example, telecommunication systems and/or chip-to-chip communication.

An integer-N frequency synthesizer can be implemented using a phase-locked loop (PLL) that includes an integer frequency divider in the PLL's feedback loop. The integer-N frequency synthesizer can be used to synthesize output frequencies in steps of a reference frequency by selecting an integer division value N of the frequency divider. For example, at steady state, the frequency of the synthesizer's output clock signal is controlled to be N times the reference clock signal's frequency. Thus, in an integer-N frequency synthesizer, at steady state the output clock signal has N periods for every period of the reference clock signal.

To provide finer steps of output frequency adjustment, a fractional-N frequency synthesizer can be used. In contrast to an integer-N frequency synthesizer that uses integer values for frequency synthesis, a fractional-N frequency synthesizer permits fractional values. At steady state, the frequency of the synthesizer's output clock signal is controlled to be N+F/M times the reference clock signal's frequency, where N is the integer portion of the frequency multiplication and F/M is the fractional portion of the frequency multiplication.

SUMMARY OF THE DISCLOSURE

Apparatus and methods for timing offset compensation of frequency synthesizers are provided herein. Frequency synthesizers are used in electronic systems to generate clock signals for controlling timing of operations of electronic circuitry. For example, a wide variety of electronic systems, such as radio frequency communications equipment operate based on timing of clock signals generated by frequency synthesizers. The performance of such electronic systems is impacted by the accuracy and/or precision of the clock signals. Certain frequency synthesizers generate clock signals that have an undesirable timing offset, such as a phase offset that is large, unpredictable, and/or changes with temperature or other operating conditions. The teachings herein provide compensation for timing offset of frequency synthesizers, thereby improving performance of electronic systems in which one or more frequency synthesizers are used for timing. For example, providing compensation for timing offset can provide higher performance, enhanced designed flexibility, lower cost, and/or a number of other benefits.

In one aspect, a clock synthesis system with timing offset compensation is provided. The clock synthesis system includes a frequency synthesizer configured to generate an output clock signal based on timing of a reference clock signal, wherein the frequency synthesizer has a timing offset that is controllable by a phase adjustment signal. The clock synthesis system further includes an integer phase-locked loop (PLL) configured to generate the phase adjustment signal based on comparing timing of the output clock signal of the frequency synthesizer to a timing reference, wherein the integer PLL is configured to control the phase adjustment signal to compensate the frequency synthesizer for the timing offset.

In another aspect, an electronic system is provided. The electronic system includes a first frequency synthesizer configured to generate a first output clock signal based on timing of a reference clock signal, wherein the first output clock signal has a timing offset relative to the reference clock signal. The electronic system further includes a first integer phase-locked loop (PLL) configured to generate a phase adjustment signal based on comparing timing of the first output clock signal to the timing of the reference clock signal, and to control the first frequency synthesizer with the phase adjustment signal to thereby compensate the first frequency synthesizer for the timing offset.

In another aspect, a method of timing offset compensation is provided. The method includes synthesizing an output clock signal based on timing of a reference clock signal, the output clock signal having a timing offset relative to the reference clock signal. The method further includes generating a phase adjustment signal based on comparing timing of the output clock signal to the timing of the reference clock signal using an integer phase-locked loop (PLL), and compensating for the timing offset using the phase adjustment signal.

DETAILED DESCRIPTION OF EMBODIMENTS

Figure 1A:
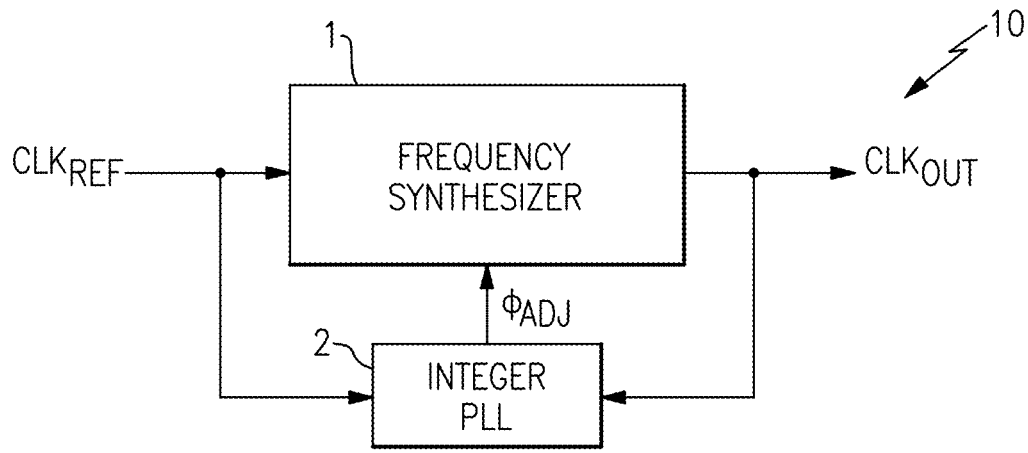
FIG. 1A is a schematic diagram of one embodiment of a clock synthesis system with timing offset compensation.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that certain embodiments can include more elements than illustrated in a drawing and/or a subset of the elements illustrated in a drawing. Further, some embodiments can incorporate any suitable combination of features from two or more drawings.

An electronic system can include a fractional-N frequency synthesizer to increase flexibility by permitting relatively small output frequency steps over a wide range of reference clock frequencies. However, absent synchronization, a fractional-N frequency synthesizer suffers from arbitrary phase startup, and thus can lock unpredictably to one of a multitude of possible phases of a reference clock signal. Furthermore, fractional-N frequency synthesizers can suffer from large static phase offset, instability, and/or poorly controlled timing offset behavior. Moreover, in applications in which the fractional-N frequency synthesizer is implemented using a delta-sigma ($\Delta\Sigma$) phase-locked loop (PLL), the synthesizer often starts with arbitrary phase with respect to timing of user events.

In certain electronic systems it can be desirable to deterministically control a phase of a frequency synthesizer's output clock signal to provide a known timing relationship with respect to a timing reference. For example, in phased array communication systems, it is desirable for frequency synthesizers operating as local oscillators to maintain the same phase relationship with respect to a common reference clock signal.

Apparatus and methods for timing offset compensation of frequency synthesizers are provided herein. In certain embodiments, an electronic system includes a frequency synthesizer, such as a fractional-N phase-locked loop (PLL), which generates an output clock signal based on timing of a reference clock signal. Additionally, the electronic system includes an integer PLL configured to compensate for a timing offset of the frequency synthesizer based on timing of the output clock signal.

Thus, the integer PLL operates in parallel to the frequency synthesizer to provide timing offset correction, such as reduction or elimination of phase offset and/or frequency offset. For example, the integer PLL can receive a timing reference (for instance, the reference clock signal used by the frequency synthesizer) and operate to reduce or eliminate a phase difference between the timing reference and the output clock signal. In certain implementations, the integer PLL is operable to control a phase difference between the output clock signal and the reference clock signal to be substantially equal to zero.

The integer PLL can correct the timing offset of the frequency synthesizer in a wide variety of ways, including, but not limited to, controlling a bleed current to a loop filter of the frequency synthesizer and/or controlling a modulator of the frequency synthesizer. For example, the integer PLL can add a phase correction to an accumulator of a delta-sigma modulator, thereby shifting the synthesizer's output phase by a corresponding amount. Thus, in certain implementations, the integer PLL is connected between an output of the frequency synthesizer and an input to a delta-sigma modulator of the frequency synthesizer. In certain implementations, the timing offset correction provided by the integer PLL is added in parts over multiple cycles of the reference clock signal, thereby maintaining the frequency synthesizer in lock without slipping cycles.

By manipulating a fractional loop of the frequency synthesizer, the startup phase of the frequency synthesizer can be controlled deterministically. Furthermore, the resulting phase offset can be relatively small and exhibit relatively low variation and temperature pushing characteristics.

In certain implementations, the integer PLL loop is implemented with relatively low phase offset and/or relatively low bandwidth. In one example, the integer PLL loop has a phase offset of less than about 100 ps and/or a loop bandwidth of less than 1 kHz. In another example, a loop bandwidth of the frequency synthesizer is at least a factor of ten greater than a loop bandwidth of the integer PLL.

By implementing the integer PLL with low loop bandwidth, an impact of the integer PLL on a noise profile of the frequency synthesizer is relatively small, even when the integer PLL operates with a relatively low sampling rate.

In certain implementations, the integer PLL loop is fabricated on a common semiconductor die with the frequency synthesizer. Implementing the frequency synthesizer and the integer PLL on a common chip aids in enhancing the accuracy of timing offset compensation and/or in providing a compact solution with low cost.

The integer PLL can include a timing detector (for instance, a phase and/or frequency detector) that generates a phase adjustment signal based on comparing timing of the output clock signal of the frequency synthesizer to timing of the reference clock signal of the frequency synthesizer. Additionally, a control circuit of the frequency synthesizer processes the phase adjustment signal to thereby change the synthesizer's output phase to achieve timing offset compensation. For example, the phase adjustment signal can operate to control a phase and/or frequency of the frequency synthesizer over time to thereby adjust timing offset.

In certain implementations, the output clock signal corresponds to an output of a voltage controlled oscillator (VCO) of the frequency synthesizer, for instance, after division by the synthesizer's output dividers and/or buffering by the synthesizer's output clock buffers. However, other implementations are possible. For example, in one embodiment, an output clock signal of a frequency synthesizer controls timing of data conversion operations of a data converter, such as a digital-to-analog converter or analog-to-digital converter. Additionally, an open-loop divider is used to generate a divided output clock signal, which is provided by feedback to serve as an input to the integer PLL, thereby synchronizing timing of the data converter to the timing reference of the integer PLL. Thus, the integer PLL can directly receive a synthesized clock signal from a frequency synthesizer or indirectly receive the synthesized clock signal after buffering, division, and/or other processing.

The frequency synthesizers herein can generate output clock signals for a wide variety of applications. In one example, the frequency synthesizer is used to generate a local oscillator signal used for mixing in a radio frequency (RF) communication system, such as a phased array communication system.

In certain implementations, multiple frequency synthesizers are synchronized in parallel. For instance, ten or more frequency synthesizers can be compensated for timing offset to coordinate communication using tens or hundreds of antennas. Thus, the teachings herein can be used to synchronize multiple frequency synthesizers in multi-synthesizer applications.

For example, a synchronization signal of relatively low frequency can be distributed to the integer PLLs along with the timing reference, which can be, for example, a few hundred megahertz. Since the operating frequencies can be selected to be relatively low, the synchronization and timing reference signals can be distributed to meet timing without a need for complicated timing paths and/or timing issues arising from fractional division. In certain implementations, the synchronization signal operates to reset dividers of the integer PLLs, thereby synchronizing frequency division of the timing reference.

The timing offset compensation schemes described herein can be used in a wide range of applications, including, but not limited to, cellular, microwave, very small aperture terminal (VSAT), test equipment, and/or sensor applications. Additionally, timing offset compensation can be provided to frequency synthesizers operating at a variety of frequencies, including not only those used for cellular communications, such as 3G, 4G, WiMAX, LTE, and Advanced LTE communications, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of electronic systems, including RF and microwave communication systems.

FIG. 1A is a schematic diagram of one embodiment of a clock synthesis system 10 with timing offset compensation. The clock synthesis system 10 includes a frequency synthesizer 1 and an integer PLL 2. As shown in FIG. 1A, the frequency synthesizer 1 generates an output clock signal $CLK_{OUT}$ based on timing of a reference clock signal $CLK_{REF}$.

The frequency synthesizer 1 can be implemented in a wide variety of ways. In one example, the frequency synthesizer 1 is implemented using a fractional-N PLL that controls a frequency of the output clock signal $CLK_{OUT}$ to be N+F/M times a frequency of the reference clock signal $CLK_{REF}$. In another example, the frequency synthesizer 1 is implemented using an integer PLL or a fractional-N PLL operating in an integer division mode.

In the illustrated embodiment, the integer PLL 2 generates a phase adjustment signal $\varphi_{ADJ}$ based on comparing timing of the output clock signal $CLK_{OUT}$ to timing of the reference clock signal $CLK_{REF}$. In certain implementations, the integer PLL 2 includes a timing detector (for instance, a phase and/or frequency detector, such as a bang-bang phase-frequency detector) that generates the phase adjustment signal $\varphi_{ADJ}$ based on the timing comparison.

The frequency synthesizer 1 and the integer PLL 2 operate with a common timing reference, in this embodiment. The integer PLL 2 can be implemented in a wide variety of ways, including, but not limited to, using analog or mixed signal configurations. In certain implementations, the phase adjustment signal $\varphi_{ADJ}$ is generated based on subsampling of the reference clock signal $CLK_{REF}$ and/or subsampling the output clock signal $CLK_{OUT}$. For example, the integer PLL 2 can include one or more dividers for dividing clock signals to provide subsampling of clock signal edges.

The integer PLL 2 can use the phase adjustment signal $\varphi_{ADJ}$ to provide correction for timing offset in a wide variety of ways. In one example, the phase adjustment signal $\varphi_{ADJ}$ controls a bleed current to a loop filter of the frequency synthesizer 1. In another example, the phase adjustment signal $\varphi_{ADJ}$ controls a state of a modulator, such as a delta-sigma modulator of the frequency synthesizer 1. Although various examples for controlling the timing offset of the frequency synthesizer 1 have been provided, the teachings herein are applicable to a wide variety of phase adjustment schemes.

In certain implementations, the clock synthesis system 10 is fabricated on a semiconductor chip or die. Thus, the frequency synthesizer 1 and the integer PLL 2 can be implemented on a common chip. Implementing the frequency synthesizer 1 and the integer PLL 2 on the same die can improve accuracy of timing offset compensation, lower cost, and/or enhance integration. However, the teachings herein are also applicable to implementations using multiple dies.

Figure 1B:
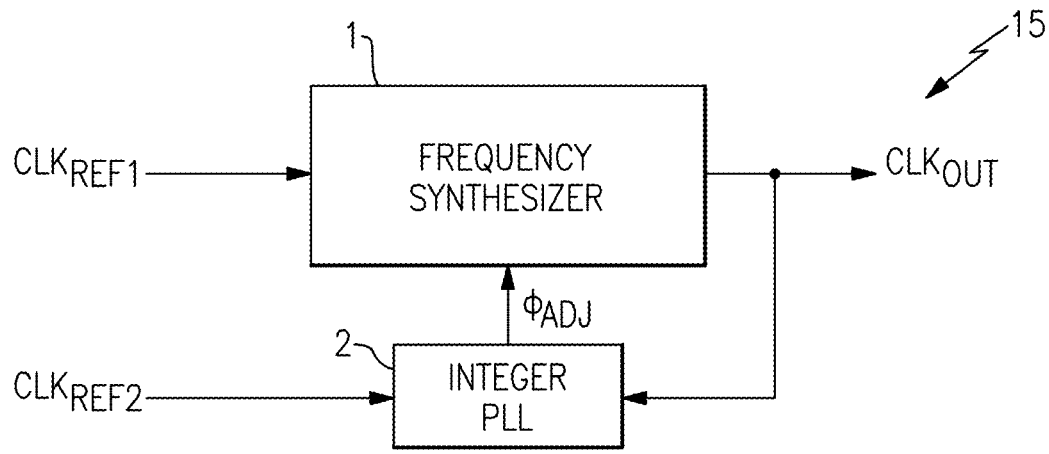
FIG. 1B is a schematic diagram of another embodiment of a clock synthesis system with timing offset compensation.

FIG. 1B is a schematic diagram of another embodiment of a clock synthesis system 15 with timing offset compensation.

The clock synthesis system 15 of FIG. 1B is similar to the clock synthesis system 10 of FIG. 1A, except that the clock synthesis system 15 of FIG. 1B illustrates an implementation in which the frequency synthesizer 1 receives a first reference clock signal $CLK_{REF1}$ and the integer PLL 2 receives a second reference clock signal $CLK_{REF2}$. In certain implementations, a frequency synthesizer and an integer PLL operate with separate timing references. In other implementations, a frequency synthesizer and an integer PLL operate with a common reference for timing. In one embodiment, the high bandwidth noise of the output clock signal $CLK_{OUT}$ is a function of the quality of the first reference clock signal $CLK_{REF1}$, but the center frequency and/or phase offset (which are low frequency effects) are governed by a potentially noisy but long-term stable second reference clock signal $CLK_{REF2}$.

Figure 1C:
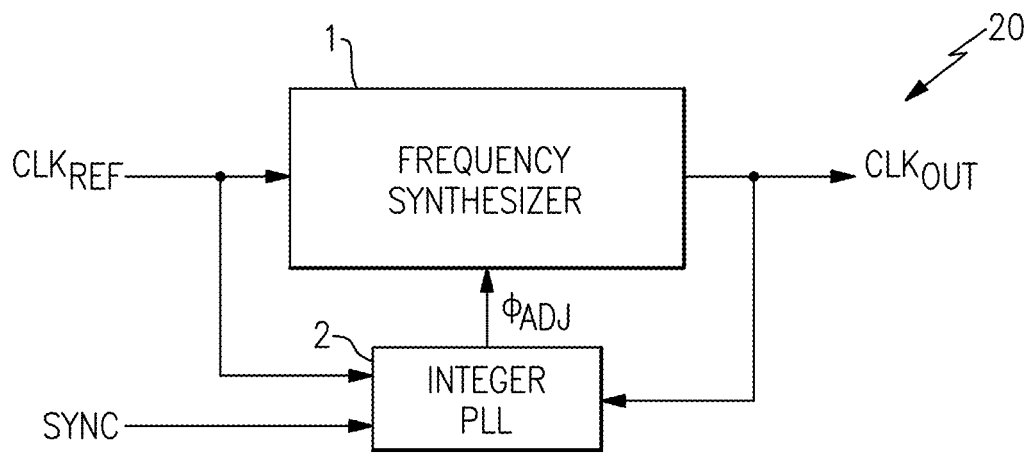
FIG. 1C is a schematic diagram of another embodiment of a clock synthesis system with timing offset compensation.

FIG. 1C is a schematic diagram of another embodiment of a clock synthesis system 20 with timing offset compensation. The clock synthesis system 20 of FIG. 1C is similar to the clock synthesis system 10 of FIG. 1A, except that the clock synthesis system 20 of FIG. 1C illustrates an implementation in which the integer PLL 2 further receives the synchronization signal SYNC.

The synchronization signal SYNC can be used to control (for instance, to reset) a state of the integer PLL 2, thereby synchronizing operation of the integer PLL relative to the synchronization signal SYNC.

Including the synchronization signal SYNC can provide a number of advantages, such as synchronizing the integer PLL 2 relative to a desired timing event and/or relative to the operation of other integer PLLs. For example, in certain applications, multiple frequency synthesizers are compensated by multiple integer PLLs, and it can be desirable to synchronize operation of the integer PLLs to thereby substantially match the output phases of the frequency synthesizers to one another.

In certain implementations, the synchronization signal SYNC can be distributed to several integer PLLs along with the reference clock signal $CLK_{REF}$ to coordinate synchronization. However, other implementations of synchronization are possible, including, but not limited to implementations in which one integer PLL generates a master synchronization signal sent to at least one other integer PLL, for instance, via a distribution network or daisy chain arrangement.

Figure 1D:
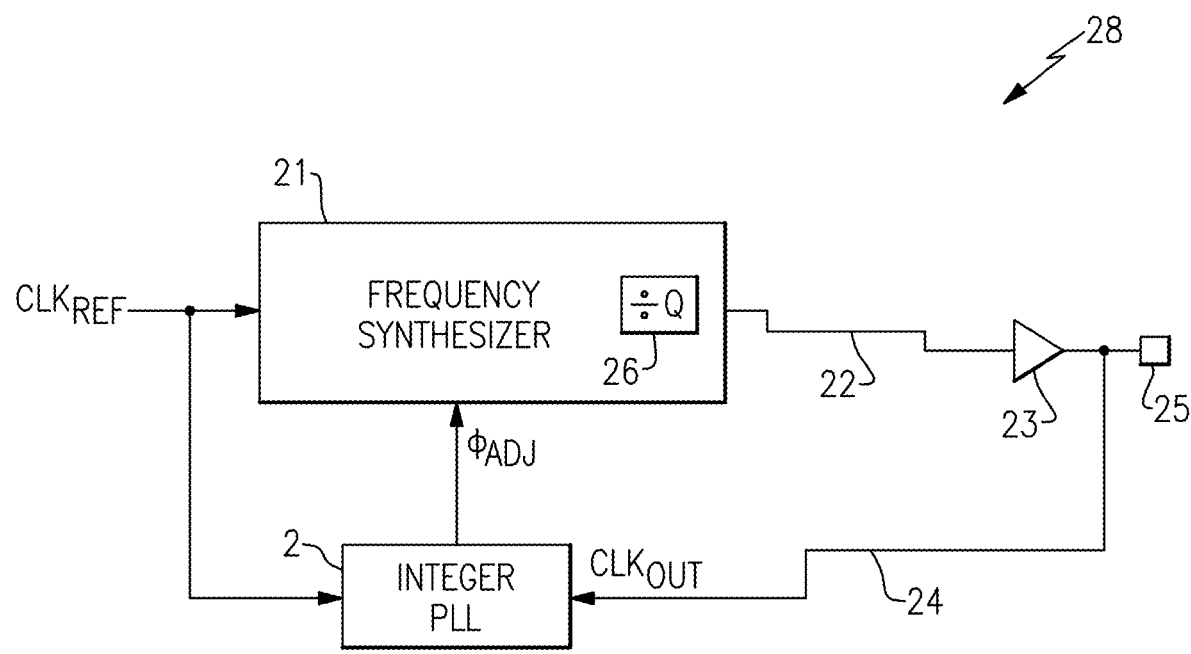
FIG. 1D is a schematic diagram of another embodiment of a clock synthesis system with timing offset compensation.

FIG. 1D is a schematic diagram of another embodiment of a clock synthesis system 28 with timing offset compensation. The clock synthesis system 28 of FIG. 1D is similar to the clock synthesis system 10 of FIG. 1A, except that the clock synthesis system 28 of FIG. 1D illustrates an implementation in which the output clock signal $CLK_{OUT}$ received by the integer PLL 2 is a derivative of a synthesized clock signal outputted by a frequency synthesizer 21.

For example, in the embodiment of FIG. 1D, the frequency synthesizer 21 includes an output divider 26 that generate a synthesized clock signal, which is provided along a first clock route 22 to a clock buffer 23, which be inverting or non-inverting. The clock buffer 23 provides a buffered clock signal to a timed circuit 25, which can be, for example, an analog-to-digital converter (ADC), a digital-to-analog converter (DAC), a wired or optical communication link, and/or a radio frequency (RF) front-end. The buffered clock signal is sent by a second clock route 24 to the integer PLL 24.

Thus, the output clock signal $CLK_{OUT}$ corresponds to a derivative of the synthesized clock signal generated by the frequency synthesizer 21. The teachings herein are not only applicable to implementations in which a synthesized clock signal from a frequency synthesizer is directly provided to an integer PLL, but also to implementations in which the clock signal from the frequency synthesizer is indirectly provided to an integer PLL. For example, the output clock signal generated by the frequency synthesizer and received by the integer PLL can correspond to a derivative of a synthesized clock signal outputted by the frequency synthesizer, for instance, after buffering, propagation along clock signal routes, division, and/or other processing.

Figure 2:
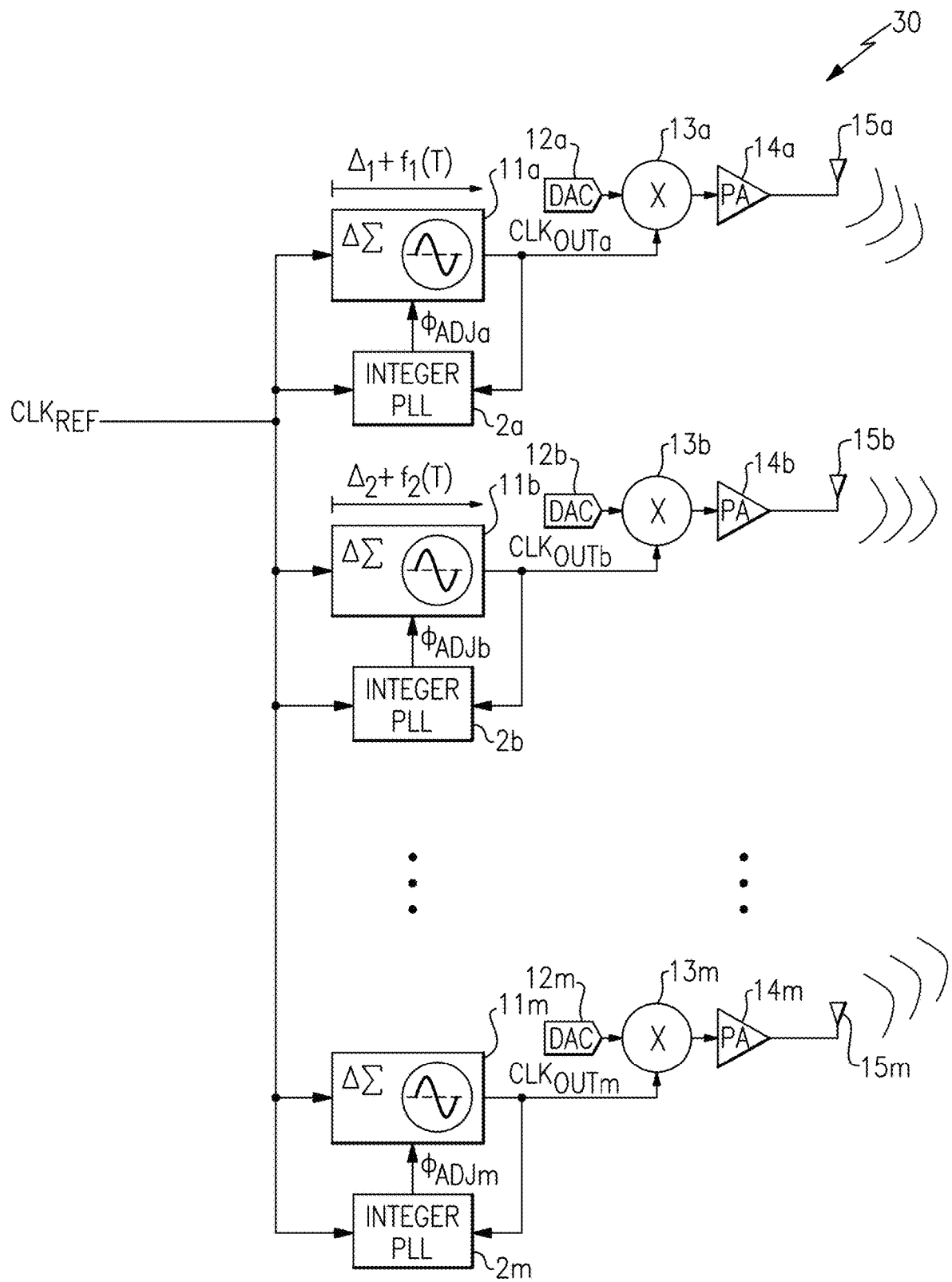
FIG. 2 is a schematic diagram of one embodiment of a phased array communication system with timing offset compensation.

FIG. 2 is a schematic diagram of one embodiment of a phased array communication system 30 with timing offset compensation. The phased array communication system 30 includes delta-sigma frequency synthesizers 11a, 11b . . . 11m, integer PLLs 2a, 2b . . . 2m, digital-to-analog converters (DACs) 12a, 12b . . . 12m, mixers 13a, 13b . . . 13m, power amplifiers (PAs) 14a, 14b . . . 14m, and antennas 15a, 15b . . . 15m.

The phased array communication system 30 illustrates one example of a multi-synthesizer system implemented in accordance with the teachings herein. However, the teachings herein are applicable to electronic systems implemented in a wide variety of ways, including, but not limited to RF communication systems that additionally or alternatively include RF receive signal paths. Thus, other implementations are possible. Although an example with three frequency synthesizers, three integer PLLs, and three RF transmit signal paths are shown, more or fewer components can be included as indicated by the ellipses.

As shown in FIG. 2, the integer PLLs 2a, 2b . . . 2m generate phase adjustment signals $\varphi_{ADJa}$, $\varphi_{ADJb}$ . . . $\varphi_{ADJm}$ for providing timing offset compensation to the delta-sigma frequency synthesizers 11a, 11b . . . 11m, respectively. Additionally, the delta-sigma frequency synthesizers 11a, 11b . . . 11m generate output clock signals $CLK_{OUTa}$, $CLK_{OUTb}$ . . . $CLK_{OUTm}$ for the mixers 13a, 13b . . . 13m, respectively. Thus, the delta-sigma frequency synthesizers 11a, 11b . . . 11m serve as local oscillators. In the illustrated embodiment, the delta-sigma frequency synthesizers 11a, 11b . . . 11m and the integer PLLs 2a, 2b . . . 2m operate using a common reference clock signal $CLK_{REF}$, and the integer PLLs 2a, 2b . . . 2m compare timing of the common reference clock signal $CLK_{REF}$ to the output clock signals $CLK_{OUTa}$, $CLK_{OUTb}$ . . . $CLK_{OUTm}$, respectively.

Including the integer PLLs 2a, 2b . . . 2m for timing offset compensation provides a number of benefits. For example, absent compensation, the delta-sigma frequency synthesizers 11a, 11b . . . 11m can have non-deterministic and/or temperature dependent phase offsets, which can vary from synthesizer to synthesizer. For instance, absent timing offset compensation, the delta-sigma frequency synthesizer 11a can have a non-deterministic phase offset $\Delta_1$ with a temperature dependence $f_1(T)$, while the frequency synthesizer 11b can have a different non-deterministic phase offset $\Delta_2$ with a different temperature dependence $f_2(T)$.

Since an accuracy of beamforming is degraded by a difference in phase offset between the synthesizers, large differences in phase offset can result in a transmit beam of the phased array communication system 30 being broken. Thus, using the integer PLLs 2a, 2b . . . 2m for timing offset compensation improvement the alignment accuracy and/or temperature stability of the phased array communication system 30, thereby enhancing beamforming operations.

Figure 3A:
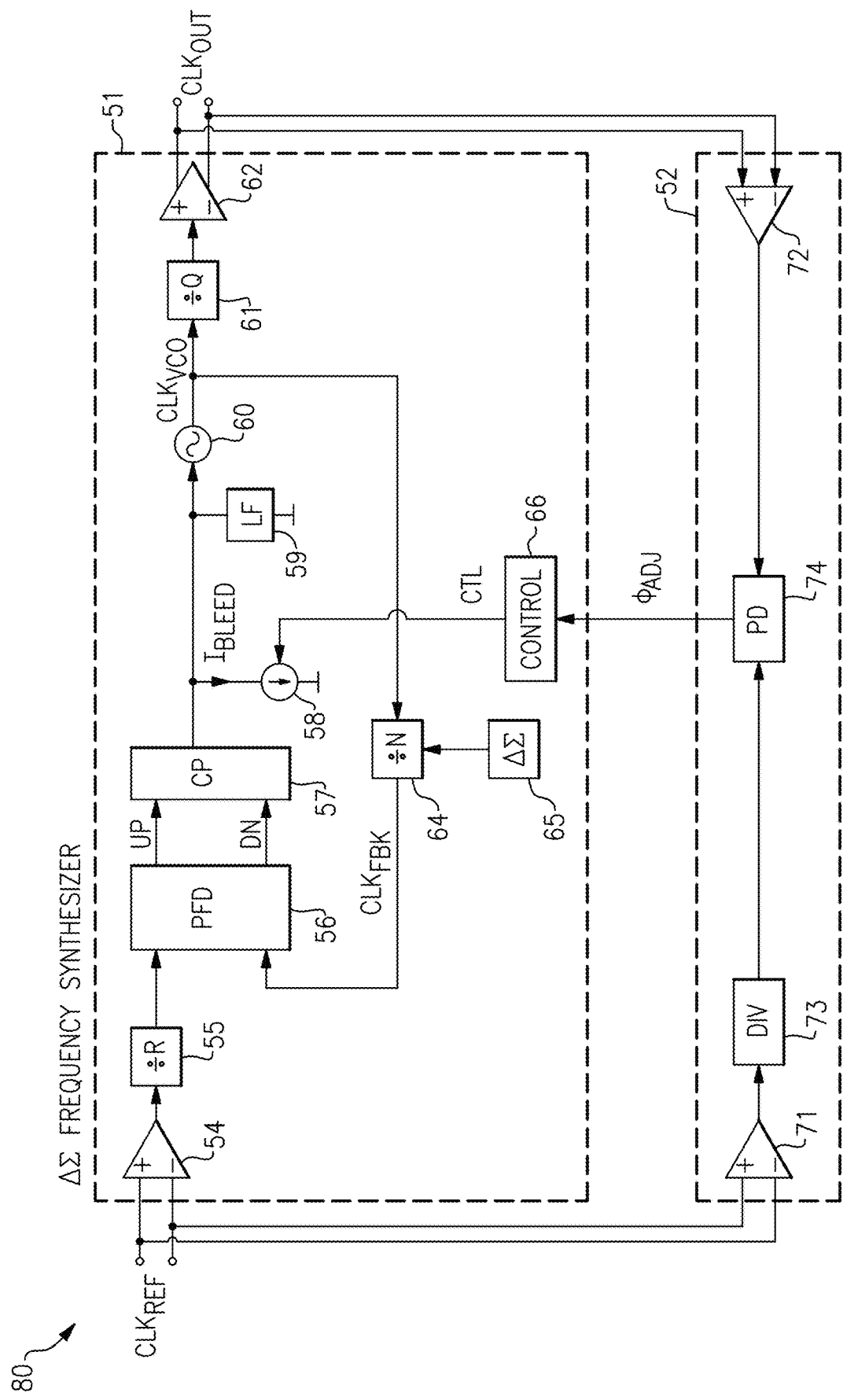
FIG. 3A is a schematic diagram of another embodiment of a clock synthesis system with timing offset compensation.

FIG. 3A is a schematic diagram of another embodiment of a clock synthesis system 80 with timing offset compensation. The clock synthesis system 80 includes a delta-sigma frequency synthesizer 51 and an integer PLL 52.

In the illustrated embodiment, the delta-sigma frequency synthesizer 51 includes an input clock buffer 54, an input divider 55 (divide by integer R, in this embodiment), a phase-frequency detector (PFD) 56, a charge pump (CP) 57, a controllable bleed current source 58, a loop filter (LF) 59, a voltage controlled oscillator (VCO) 60, an output divider 61 (divide by integer Q, in this embodiment), an output clock buffer 62, a feedback divider 64 (divide by integer N, in this embodiment), a delta-sigma modulator 65, and a control circuit 66. Although one embodiment of a frequency synthesizer is shown, the teachings herein are applicable to frequency synthesizers implemented in a wide variety of ways.

The input clock buffer 54 provides buffering to the reference clock signal $CLK_{REF}$, which is implemented differentially, in this embodiment. Additionally, the input divider 55 generates a divided reference clock signal by dividing the frequency of the buffered reference clock signal. The PFD 56 compares timing of the divided reference clock signal to timing of a feedback clock signal $CLK_{FBK}$. Additionally, the PFD 56 generates an up signal UP and a down signal DN based on the timing comparison. The CP 57 processes the up signal UP and the down signal DN to control an amount of current from the CP 57 to the loop filter 59. For example, the CP 57 can include an up current source that is selectively activated by the up signal UP to charge a capacitance of the loop filter 59, and a down current source that is selectively activated by the down signal DN to discharge the loop filter's capacitance.

With continuing reference to FIG. 3A, a voltage of the loop filter 59 serves as an input of the VCO 60 to thereby control the oscillation frequency of a VCO clock signal $CLK_{VCO}$ outputted by the VCO 60. The output divider 61 divides the VCO clock signal $CLK_{VCO}$ to generate a divided VCO clock signal, which is buffered by the output clock buffer 62 to generate a differential output clock signal $CLK_{OUT}$. Additionally, the feedback divider 64 divides the VCO clock signal $CLK_{VCO}$ to generate the feedback clock signal $CLK_{FBK}$. The delta-sigma modulator 65 controls a division rate of the feedback divider 64 over time to thereby control frequency synthesis, which can be fractional or integer.

In the illustrated embodiment, the delta-sigma frequency synthesizer 51 also includes the bleed current source 58, which provides a bleed current $I_{BLEED}$ to the loop filter 59. The amount of the bleed current $I_{BLEED}$ controls a phase difference between the clock signals inputted to the PFD 56, and thus serves as a mechanism for controlling the timing offset of the synthesizer 51. For example, the amount of the bleed current $I_{BLEED}$ controls a fixed charge into the loop filter 59 while the synthesizer 51 is locked. Although frequency locking results in a substantially constant value of the loop filter voltage, the PFD 56 will operate with an input phase difference to cancel the charge introduced by the bleed current source 58.

Thus, control of a bleed current is one example of a knob or mechanism for tuning timing offset of a frequency synthesizer. However, a wide variety of circuitry can be used for controlling timing offset of a frequency synthesizer.

With continuing reference to FIG. 3A, the integer PLL 52 includes a first or reference clock buffer 71, a second or output clock buffer 72, a reference clock divider 73, and a phase detector 74. Although one embodiment of an integer PLL is shown, the teachings herein are applicable to integer PLLs implemented in a wide variety of ways. In certain implementations, a division rate of the reference clock divider 73 is controllable, for instance, user-programmable via digital data provided over a serial interface. Indeed, any of the dividers herein can be implemented with a controllable divisor value.

The reference clock buffer 71 buffers the reference clock signal $CLK_{REF}$ to generate a buffered reference clock signal, which is divided in frequency by the reference clock divider 73 to generate a first input clock signal to the phase detector 74. Additionally, the output clock buffer 72 buffers the output clock signal $CLK_{OUT}$ to generate a buffered output clock signal that serves as a second input clock signal to the phase detector 74. In certain implementations, the integer PLL 52 further includes an output clock signal divider operable to divide the frequency of the second input clock signal to the phase detector 74.

The phase detector 74 compares timing of the first input clock signal to timing of the second input clock signal to generate a phase adjustment signal $\varphi_{ADJ}$. Additionally, the control circuit 66 of the delta-sigma frequency synthesizer 51 processes the phase adjustment signal $\varphi_{ADJ}$ to generate a control signal CTL for controlling the amount of the bleed current $I_{BLEED}$.

Accordingly, the phase adjustment signal $\varphi_{ADJ}$ operates to control the timing offset of the delta-sigma frequency synthesizer 51 by indirectly controlling the bleed current $I_{BLEED}$, in this example.

In the illustrated embodiment, the integer PLL 52 is implemented using a relatively slow bang-bang subsampling closed loop around the delta-sigma frequency synthesizer 51. The integer PLL 52 operates to reduce or eliminate timing offset and temperature pushing. Although illustrated in the context of one integer PLL and one frequency synthesizer, the teachings here are applicable to providing timing offset compensation to multiple frequency synthesizers, such as an array of fractional-N frequency synthesizers.

By including the integer PLL 52, timing offset of the delta-sigma frequency synthesizer 51 can be compensated. For example, timing offset can arise in the delta-sigma frequency synthesizer 51 from a wide range of sources, including, but not limited to, offset of the charge pump 57, a non-deterministic startup phase of the output divider 61, an unknown startup state of the delta-sigma modulator 65 (for instance, a non-deterministic startup value of an accumulator), and/or an unknown startup state of the input divider 55. Moreover, in implementations involving synchronization of multiple frequency synthesizers, timing offset can arise from mismatch between the reference signal paths and/or the VCO paths of the synthesizers.

As shown in FIG. 3A, the clock synthesis system 80 includes a fractional loop through the PFD 56, the CP 57, the VCO 60, and the feedback divider 64. Additionally, the clock synthesis system 80 further includes an integer loop through the VCO 60, output divider 61, output clock buffer 62, the second clock buffer 72, the phase detector 74, the control circuit 66, and the bleed current source 58. Although one embodiment of a fractional loop and one embodiment of an integer loop are illustrated, the teachings herein are applicable to fractional loops and integer loops implemented in a wide variety of ways.

The fractional loop provided by the delta-sigma frequency synthesizer 51 operates to lock the output clock signal $CLK_{OUT}$ to the reference clock signal $CLK_{REF}$ with desired frequency relationship, which can be fractional. Although delta-sigma frequency synthesizers can provide high flexibility, low noise, and/or a number of other benefits, delta-sigma frequency synthesizers can suffer from static phase offset that is large, uncontrollable, and/or dependent on temperature or other operating variables.

By including the integer PLL 52 to form the integer loop, the timing offset of the delta-sigma frequency synthesizer 51 is compensated. Thus, the advantages of a delta-sigma frequency synthesizer are provided while reducing or eliminating the disadvantage of poor phase offset characteristics.

Figure 3B:
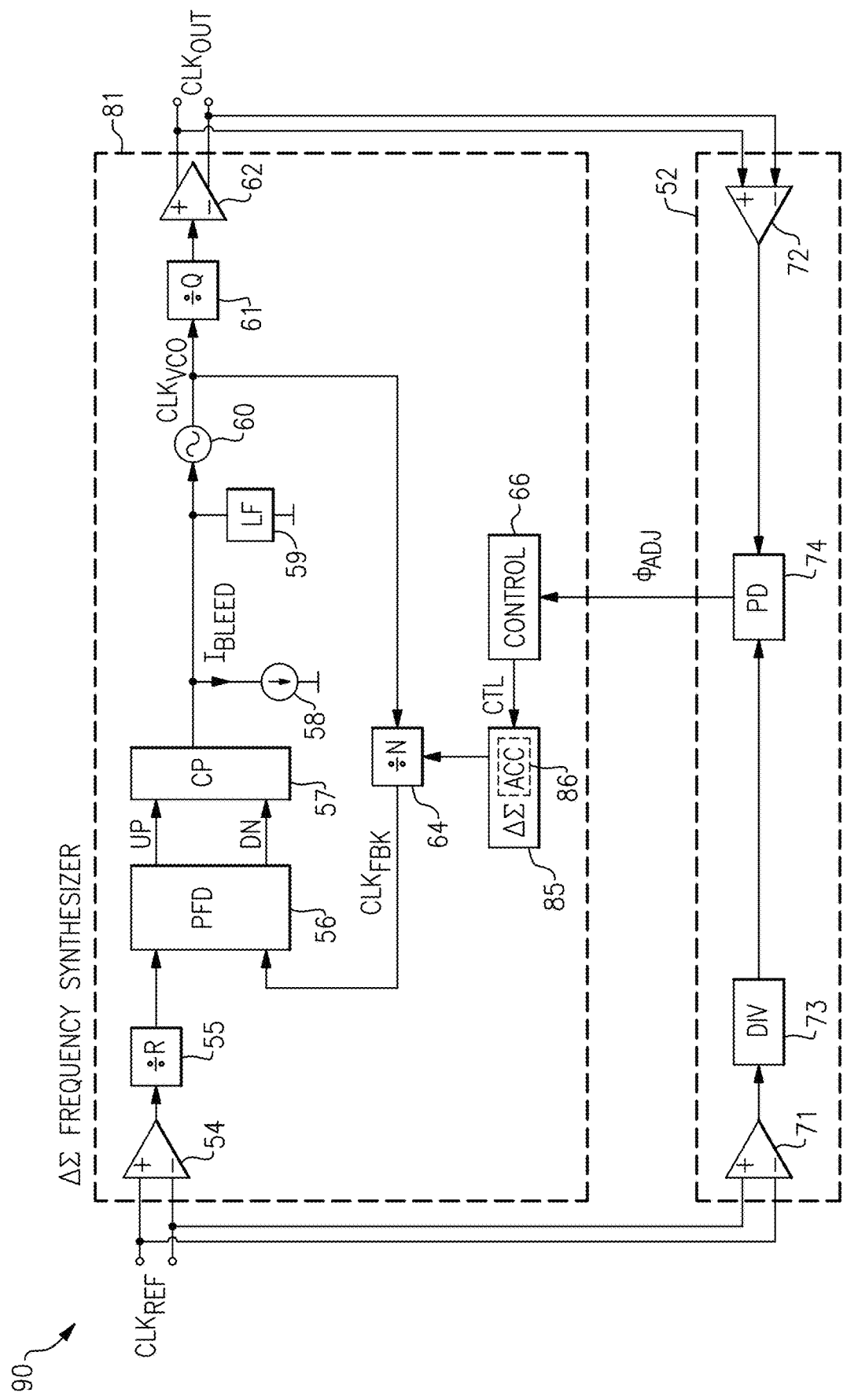
FIG. 3B is a schematic diagram of another embodiment of a clock synthesis system with timing offset compensation.

FIG. 3B is a schematic diagram of another embodiment of a clock synthesis system 90 with timing offset compensation. The clock synthesis system 90 of FIG. 3B is similar to the clock synthesis system 80 of FIG. 3A, except that the clock synthesis system 90 includes a delta-sigma frequency synthesizer 81 that has a timing offset compensated by way of controlling a delta-sigma modulator 85 of the synthesizer 81.

For example, in the illustrated embodiment, the control signal CTL from the control circuit 66 is provided to the delta-sigma modulator 85. Additionally, the control signal CTL provides a phase correction to an accumulator 86 of the delta-sigma modulator 85, thereby shifting the output phase of the synthesizer 81 by a corresponding amount. Thus, the integer PLL 52 operates between an output of the frequency synthesizer 81 and an input to the delta-sigma modulator 85, in this embodiment.

Figure 4A:
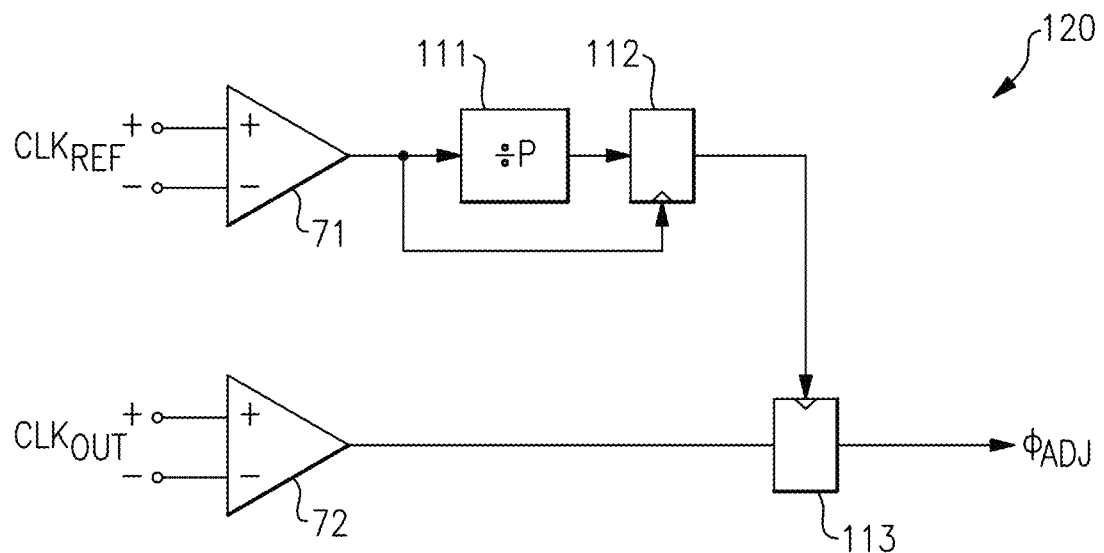
FIG. 4A is a schematic diagram of an integer phase-locked loop (PLL) according to one embodiment.

FIG. 4A is a schematic diagram of an integer PLL 120 according to one embodiment. The integer PLL 120 includes a reference clock buffer 71, a divider 111 (divide by P, in this example), a retiming circuit 112 (implemented as a flip-flop, in this example), and a phase detection circuit 113 (implemented as a flip-flop, in this example). Although one embodiment of an integer PLL is shown, the teachings herein are applicable to integer PLLs implemented in a wide variety of ways.

In the illustrated embodiment, the reference clock buffer 71 generates a buffered reference clock signal by buffering the reference clock signal $CLK_{REF}$, which is implemented differentially in this example. Additionally, the divider 111 generates a divided reference clock signal by dividing the buffered reference clock signal by an integer P, which is controllable (for instance, user-programmable via an interface or bus). The divided reference clock signal is retimed by the retiming circuit 112 to generate a first input clock signal to the phase detection circuit 113. Furthermore, the output clock buffer 72 buffers the output clock signal $CLK_{OUT}$ to generate a second input clock signal to the phase detection circuit 113.

The phase detection circuit 113 compares timing of the first input clock signal (provided to a clock input of the flip-flop, in this example) to timing of the second input clock signal (provided to a data input of the flip-flop, in this example), and outputs the phase adjustment signal $\varphi_{ADJ}$ based on the timing comparison. In the illustrated embodiment, the phase adjustment signal $\varphi_{ADJ}$ is a binary signal indicating whether or not timing of the output clock signal $CLK_{OUT}$ is early or late relative to the reference clock signal $CLK_{REF}$. However, the phase adjustment signal $\varphi_{ADJ}$ can be implemented in other ways, including, for example, implementations in which the phase adjustment signal $\varphi_{ADJ}$ is an analog signal or a multi-bit digital signal.

Figure 4B:
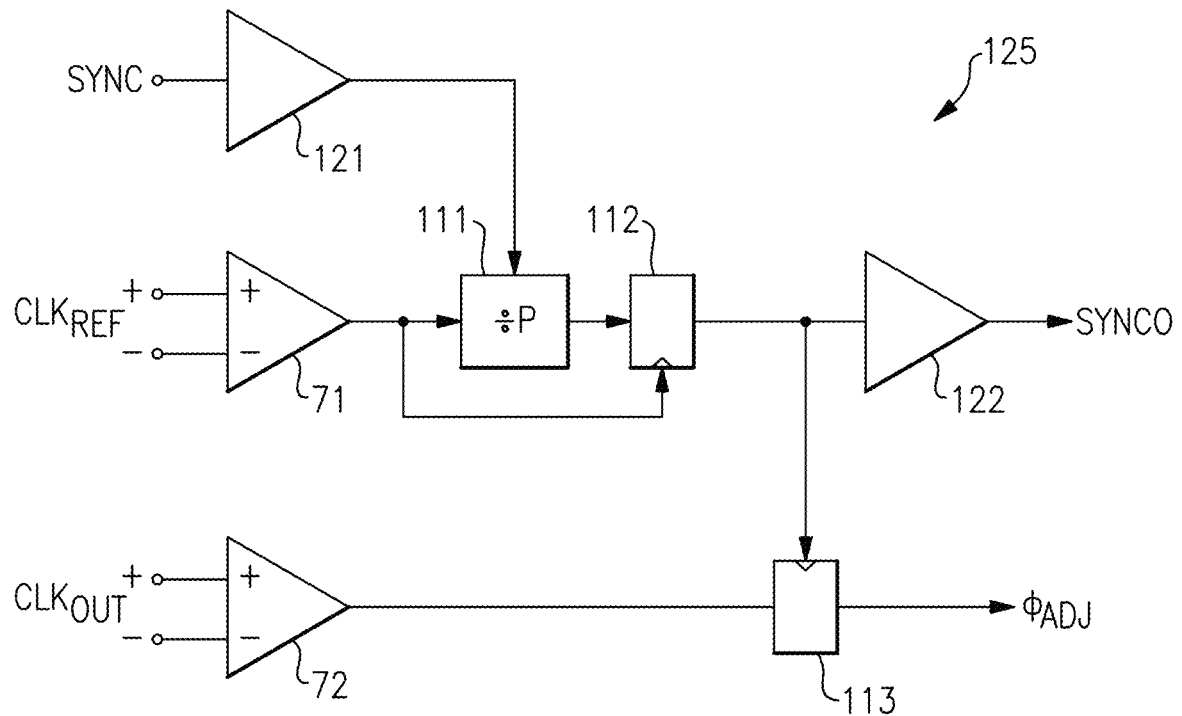
FIG. 4B is a schematic diagram of an integer PLL according to another embodiment.

FIG. 4B is a schematic diagram of an integer PLL 125 according to another embodiment. The integer PLL 125 of FIG. 4B is similar to the integer PLL 120 of FIG. 4A, except that the integer PLL 125 further includes an input synchronization buffer 121 and an output synchronization buffer 122.

As shown in FIG. 4B, the input synchronization buffer 121 receives a synchronization signal SYNC, and provides a buffered synchronization signal to a reset input of the divider 111. Thus, the divider 111 is reset based on timing of the synchronization signal SYNC.

Accordingly, the synchronization signal SYNC is used to control synchronization of the integer PLL 125.

The synchronization signal SYNC can provide a number of advantages, such as synchronizing the integer PLL 125 relative to a desired timing event and/or relative to the operation of other integer PLLs. For example, in certain applications, the timing offsets of multiple frequency synthesizers are compensated by multiple integer PLLs, and it can be desirable to synchronize operation of the integer PLLs with respect to one another.

In certain implementations, the synchronization signal SYNC can be distributed to multiple integer PLLs along with the reference clock signal $CLK_{REF}$ to coordinate synchronization. However, other implementations of synchronization are possible, including, but not limited to implementations in which one integer PLL generates a master synchronization signal sent to other integer PLLs, for instance, via a distribution network or daisy chain arrangement.

For example, in the illustrated embodiment, the output synchronization buffer 122 outputs an output synchronization signal SYNCO, which can be used downstream by one or more integer PLLs to control synchronization.

Figure 5A:
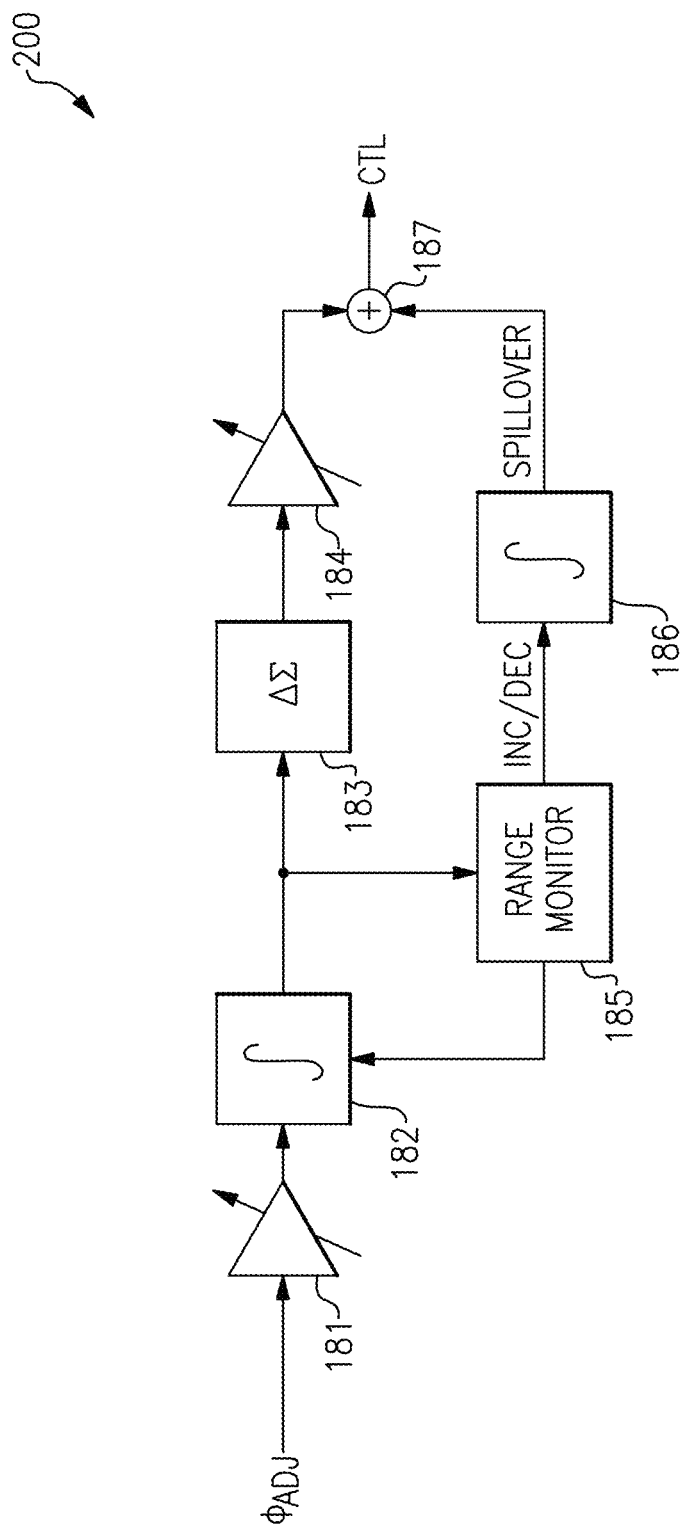
FIG. 5A is a schematic diagram of one embodiment of a control circuit for controlling timing offset.

FIG. 5A is a schematic diagram of one embodiment of a control circuit 200 for controlling timing offset. The control circuit 200 includes a controllable gain input buffer 181, a first integrator 182 (for instance, a first digital accumulator), a delta-sigma modulator 183, a controllable gain output buffer 184, a range monitor 185, a second integrator 186 (for instance, a second digital accumulator), and an adder 187.

The control circuit 200 illustrates one implementation of a control circuit for controlling a timing offset of a frequency synthesizer based on a phase adjustment signal. For example, the control circuit 200 corresponds to one embodiment of the control circuit 66 of FIGS. 3A-3B. Although one embodiment of a control circuit is shown, timing offset of a frequency synthesizer can be adjusted in a wide variety of ways.

The controllable gain input buffer 181 includes an input that receives a phase adjustment signal $\varphi_{ADJ}$ from an integer PLL, and an output coupled to the first integrator 182. The accumulated output signal of the first integrator 182 is provided to the delta-sigma modulator 183 and to the range monitor 185. In certain implementations, the accumulated output signal is a multi-bit digital signal representing a fractional phase correction value.

In certain implementations, an input signal range of the delta-sigma modulator 183 for high performance is limited. For instance, in one example, a two point delta-sigma modulator is capable of processing an input signal ranging between −1.0 and +1.0, but operates with higher performance when the input signal is confined between −0.5 and +0.5 relative to when the input signal is outside this range. In implementations in which it is desirable to operate the delta-sigma modulator 183 within a desired input signal range, the range monitor 185 can be included to provide adjustment to an accumulated value of the first integrator 182 to maintain the input signal to the delta-sigma modulator 183 within the desired input signal range.

To correct for the adjustment to the accumulated value of the first integrator 182, the range monitor 185 outputs an increment/decrement signal (INC/DEC), which is integrated by the second integrator 186 to generate a spillover signal (SPILLOVER). The adder 187 generates the control signal CTL by combining the spillover signal with an output of the delta-sigma modulator 183 after buffering by the controllable gain output buffer 184. Inclusion of the controllable gain input buffer 181 and/or the controllable gain output buffer 184 can provide a number of advantages, including, but not limited to, improved performance by providing compensation for non-idealities of subsequent logic when exposed to the sequence from the delta-sigma modulator 183 and/or enhanced flexibility to enable a wider range of applications or usage scenarios.

Changes to the control signal CTL over time indicate whether the phase offset of the frequency synthesizer should be increased or decreased. Including the delta-sigma modulator 183 operates to provide noise filtering to the control signal CTL, thereby providing higher linearity and/or superior spectral properties. In certain implementations, the control signal CTL is used to provide adjustment to the frequency synthesizer's delta-sigma modulator, for instance, as shown in the embodiment of FIG. 3A.

Figure 5B:
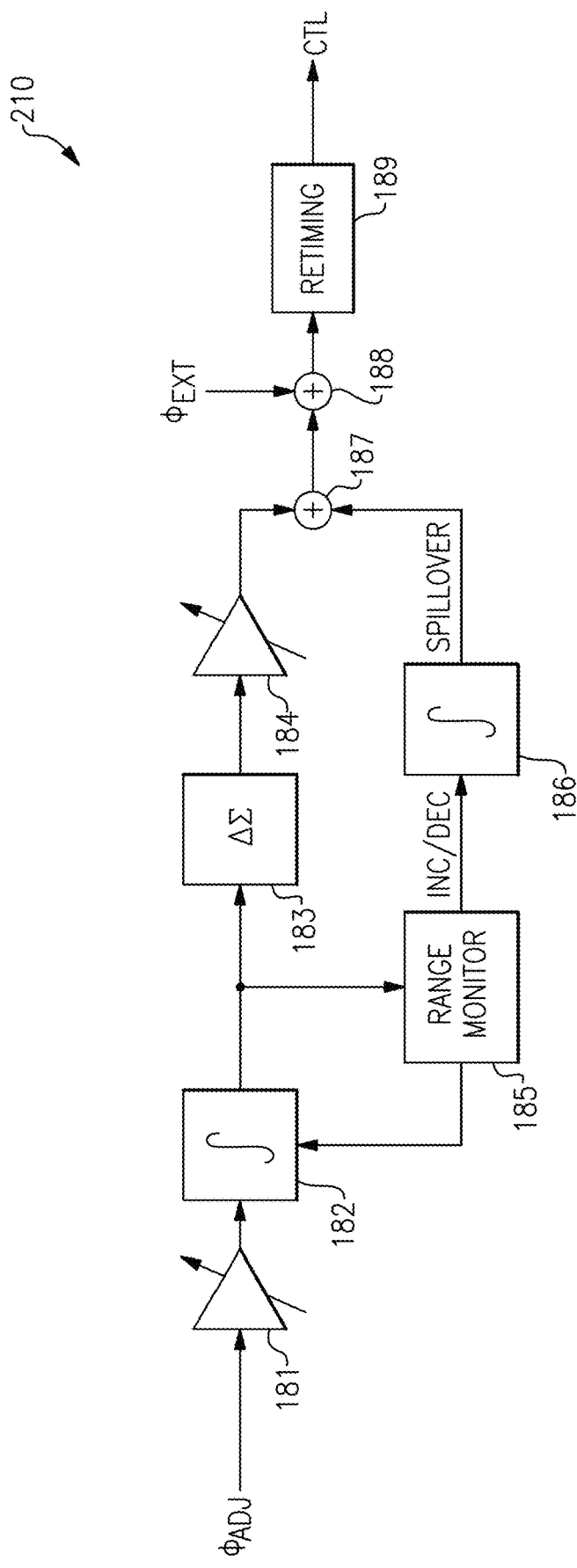
FIG. 5B is a schematic diagram of another embodiment of a control circuit for controlling timing offset.

FIG. 5B is a schematic diagram of another embodiment of a control circuit 210 for controlling timing offset. Although one embodiment of a control circuit for providing timing offset adjustment to a frequency synthesizer is shown, other implementations are possible.

The control circuit 210 of FIG. 5B is similar to the control circuit 200 of FIG. 5A, except that the control circuit 210 further includes a second adder 188 and a retiming circuit 189. In the illustrated embodiment, the second adder 188 combines an external phase signal $\varphi_{EXT}$ with the output of the first adder 187. In certain implementations, the external phase signal $\varphi_{EXT}$ is user-controlled, for instance, via an interface or bus. As shown in FIG. 5B, the output of the second adder 188 is retimed by the retiming circuit 189 to generate the control signal CTL.

The control circuit 210 of FIG. 5B can be advantageously used to provide timing offset adjustment by control of a bleed current to a loop filter of a frequency synthesizer, for example, as illustrated in the embodiment of FIG. 3A. In particular, by including the external phase signal $\varphi_{EXT}$, a mechanism is provided for changing an input phase difference to the frequency synthesizer's PFD, thereby allowing flexibility to operate the PFD away from a zero input phase difference, which can be associated with non-linearity and/or degraded performance. Furthermore, inclusion of the retiming circuit 189 provides control over timing of changes to the value of the control signal CTL. Providing control over timing of updates to the control signal CTL can provide a number of advantages, such as reduced quantization noise, lower switching noise, higher linearity, and/or reduced memory effects.

Figure 6A:
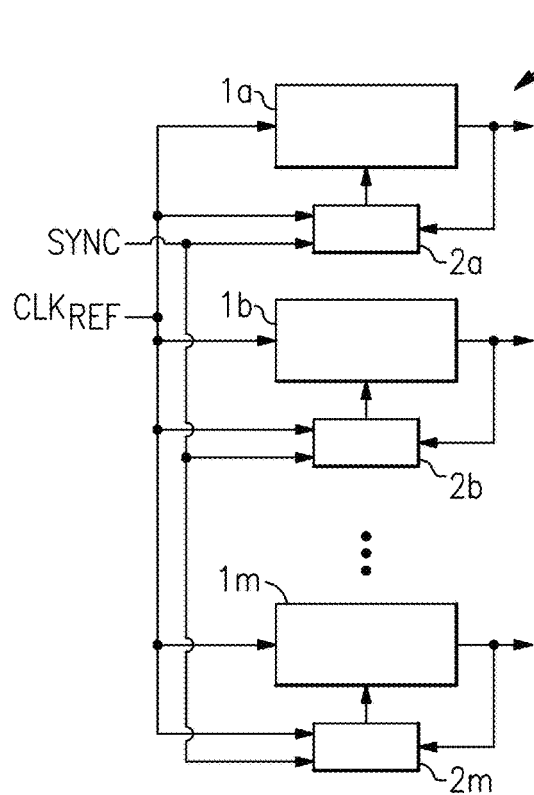
FIG. 6A is a schematic diagram of one embodiment of a multi-synthesizer system with timing offset compensation.

FIG. 6A is a schematic diagram of one embodiment of a multi-synthesizer system 300 with timing offset compensation. The multi-synthesizer system 300 includes frequency synthesizers 1a, 1b ... 1m and integer PLLs 2a, 2b ... 2m. Although an example with three frequency synthesizers and three integer PLLs is shown, more or fewer components can be included as indicated by the ellipses. In certain implementations, each corresponding pair of frequency synthesizer and integer PLL is fabricated on a different semiconductor die, and the multi-synthesizer system 300 is implemented on a printed circuit board (PCB) or multi-chip module (MCM).

In the illustrated embodiment, a synchronization signal SYNC is distributed to the integer PLLs 2a, 2b ... 2m, for instance, using a clock tree or other suitable distribution network. Thus, the synchronization signal SYNC and the reference clock signal $CLK_{REF}$ are distributed to the integer PLLs 2a, 2b ... 2m, in this embodiment. Since the operating frequencies can be selected to be relatively low, the synchronization signal SYNC and the reference clock signal $CLK_{REF}$ can be distributed to meet timing without a need for complicated timing paths and/or fractional timing issues. In certain implementations, the synchronization signal SYNC operates to reset dividers of the integer PLLs 2a, 2b ... 2m to thereby achieve synchronization.

Figure 6B:
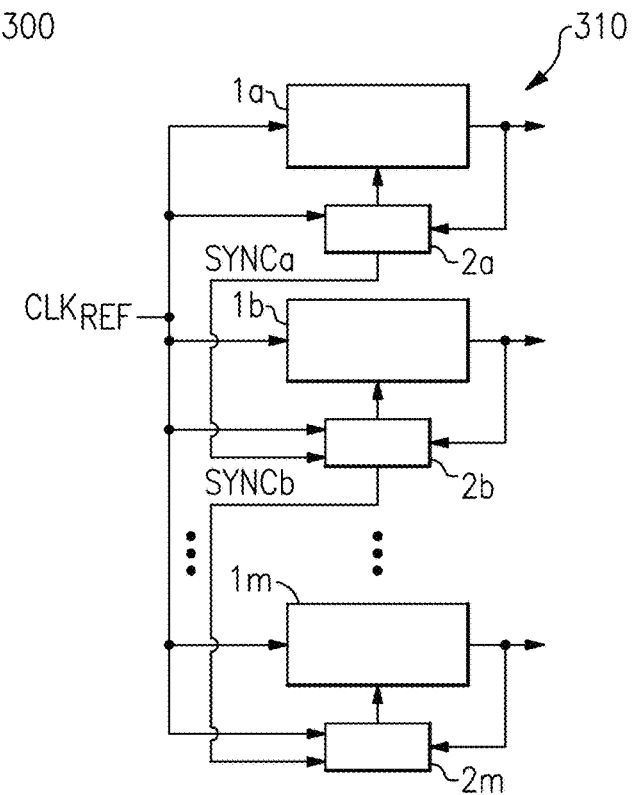
FIG. 6B is a schematic diagram of another embodiment of a multi-synthesizer system with timing offset compensation.

FIG. 6B is a schematic diagram of another embodiment of a multi-synthesizer system 310 with timing offset compensation. The multi-synthesizer system 310 includes frequency synthesizers 1a, 1b ... 1m and integer PLLs 2a, 2b ... 2m. Although an example with three frequency synthesizers and three integer PLLs is shown, more or fewer components can be included as indicated by the ellipses.

In the illustrated embodiment, the integer PLL 2a generates a first synchronization signal SYNCa, which is used to control synchronization of the integer PLL 2b. Thus, the integer PLL 2a serves as a master and the integer PLL 2b as a slave. Additionally, the integer PLL 2b generates a second synchronization signal SYNCb, which is used to control synchronization of the integer PLL 2m. The multi-synthesizer system 310 illustrates an implementation of synchronization using a daisy chain arrangement.

In certain implementations, the synchronization signal outputted by a given integer PLL is generated early in time to compensate for a delay in the synchronization signal propagating to the next integer PLL in the chain. Implementing the timing of synchronization signal generation in this manner can aid in achieving synchronization even in implementations associated with relatively long propagation delays. In certain implementations, the integer PLL is programmable (for instance, via an interface or bus) to control early timing generation to thereby provide flexibility to control synchronization in a wide range of applications and deployment scenarios.

Although examples of synchronization of multi-synthesizer systems have been depicted in FIGS. 6A and 6B, a multi-synthesizer system can include synchronization implemented in a wide variety of ways. Accordingly, other implementations are possible.

Figure 7:
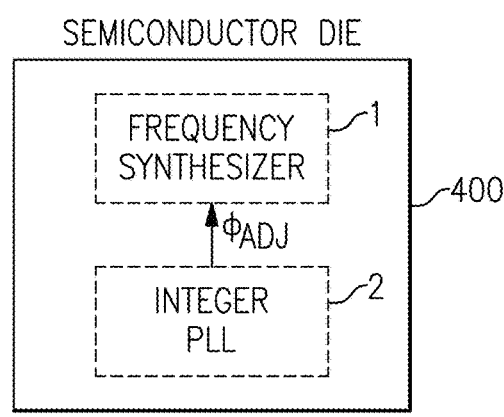
FIG. 7 is a schematic diagram of one embodiment of a semiconductor die.

FIG. 7 is a schematic diagram of one embodiment of a semiconductor die 400. In this embodiment, the frequency synthesizer 1 and the integer PLL 2 are fabricated on a common semiconductor die. Implementing the frequency synthesizer and the integer PLL on a common chip aids in enhancing the accuracy of timing offset compensation and/ or in providing a compact solution with low cost. Although integrating the frequency synthesizer 1 and the integer PLL 2 on a common chip can provide a number of advantages, the teachings herein are also applicable to configurations in which the frequency synthesizer 1 and the integer PLL 2 are formed on separate dies.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A clock synthesis system with timing offset compensation, the clock synthesis system comprising:
   a frequency synthesizer configured to generate an output clock signal based on comparing timing of a reference clock signal to a first feedback signal, the output clock having a timing offset that is controllable by a phase adjustment signal, wherein the frequency synthesizer comprises:
      a control circuit including a digital accumulator configured to control the timing offset based on accumulating the phase adjustment signal,
      a feedback divider in a loop and configured to generate the first feedback signal, and
      a delta-sigma modulator configured to control a division rate of the feedback divider; and
   an integer phase-locked loop (PLL) configured to generate the phase adjustment signal based on comparing timing of the output clock signal of the frequency synthesizer to a timing reference, and to control the phase adjustment signal to compensate the frequency synthesizer for the timing offset, wherein the integer PLL comprises a phase detector configured to generate the phase adjustment signal by comparing the timing of the reference clock signal to a second feedback signal corresponding to the output clock signal.

2. The clock synthesis system of claim 1, wherein the timing reference is the reference clock signal.

3. The clock synthesis system of claim 2, wherein the integer PLL is operable to control a phase difference between the output clock signal and the reference clock signal to be substantially equal to zero.

4. The clock synthesis system of claim 1, wherein the phase adjustment signal is operable to change the timing offset of the frequency synthesizer by adjusting a state of the delta-sigma modulator.

5. The clock synthesis system of claim 1, wherein the frequency synthesizer comprises a loop filter and a bleed current source configured to provide a bleed current to the loop filter, wherein the phase adjustment signal is operable to change the timing offset of the frequency synthesizer by controlling an amount of the bleed current.

6. The clock synthesis system of claim 1, wherein a loop bandwidth of the frequency synthesizer is greater than a loop bandwidth of the integer PLL.

7. The clock synthesis system of claim 1, wherein the integer PLL comprises a flip-flop including a data input controlled by the output clock signal, a clock input controlled by the reference clock signal, and an output configured to generate the phase adjustment signal.

8. The clock synthesis system of claim 1, wherein the timing offset comprises an arbitrary initial phase offset with respect to the reference clock signal.

9. The clock synthesis system of claim 1, wherein the frequency synthesizer further comprises a loop filter and a single charge pump configured to an amount of current from the charge pump to the loop filter.

10. An electronic system comprising:
a first frequency synthesizer configured to generate a first output clock signal based on comparing timing of a reference clock signal to a first feedback signal, the first output clock signal having a timing offset relative to the reference clock signal that is controllable by a phase adjustment signal, wherein the first frequency synthesizer comprises:
a control circuit including a digital accumulator configured to control the timing offset based on accumulating the phase adjustment signal,
a feedback divider in a loop and configured to generate the first feedback signal, and
a delta-sigma modulator configured to control a division rate of the feedback divider; and
a first integer phase-locked loop (PLL) configured to generate the phase adjustment signal based on comparing timing of the first output clock signal to the timing of the reference clock signal, and to control the first frequency synthesizer with the phase adjustment signal to thereby compensate the first frequency synthesizer for the timing offset, wherein the first integer PLL comprises a phase detector configured to generate the phase adjustment signal by comparing the timing of the reference clock signal to a second feedback signal corresponding to the first output clock signal.

11. The electronic system of claim 10, wherein the first integer PLL is operable to control a phase difference between the first output clock signal and the reference clock signal to be substantially equal to zero.

12. The electronic system of claim 10, further comprising a second frequency synthesizer configured to generate a second output clock signal based on the timing of the reference clock signal, and a second integer PLL configured to provide timing offset compensation to the second frequency synthesizer based on comparing timing of the second output clock signal to the timing of the reference clock signal.

13. The electronic system of claim 12, further comprising a first mixer controlled by the first output clock signal and a second mixer controlled by the second output clock signal.

14. The electronic system of claim 12, wherein the first frequency synthesizer is configured to output a synthesized clock signal, wherein the first output clock signal corresponds to a derivative of the synthesized clock signal.

15. The electronic system of claim 12, wherein the first integer PLL is configured to provide a synchronization signal to the second integer PLL, wherein the synchronization signal is operable to synchronize the first integer PLL and the second integer PLL.

16. The electronic system of claim 10, wherein the phase adjustment signal is operable to change the timing offset of the first frequency synthesizer by adjusting a state of the delta-sigma modulator.

17. The electronic system of claim 10, wherein the first frequency synthesizer comprises a loop filter and a bleed current source configured to provide a bleed current to the loop filter, wherein the phase adjustment signal is operable to change the timing offset of the first frequency synthesizer by controlling an amount of the bleed current.

18. A method of timing offset compensation, the method comprising:
synthesizing an output clock signal using a frequency synthesizer based on comparing timing of a reference clock signal to a first feedback signal, the output clock signal having a timing offset relative to the reference clock signal that is controllable by a phase adjustment signal, wherein the synthesizing of the output clock is further based on a control signal received from a control circuit including a digital accumulator configured to control the timing offset based on accumulating the phase adjustment signal, using a feedback divider in a loop to generate the first feedback signal, and using a delta-sigma modulator to control a division rate of the feedback divider;
generating the phase adjustment signal based on comparing timing of the output clock signal to the timing of the reference clock signal using an integer phase-locked loop (PLL), wherein the integer PLL comprises a phase detector configured to generate the phase adjustment signal by comparing the timing of the reference clock signal to a second feedback signal corresponding to the output clock signal; and
compensating for the timing offset using the phase adjustment signal.

19. The method of claim 18, wherein compensating for the timing offset comprises controlling a phase difference between the output clock signal and the reference clock signal to be substantially equal to zero.

20. The method of claim 18, wherein compensating for the timing offset comprises at least one of adjusting a bleed current to a loop filter or adjusting a state of a delta-sigma modulator.

* * * * *